United States Patent
Kim

(10) Patent No.: US 6,906,570 B2
(45) Date of Patent: Jun. 14, 2005

(54) MULTI CLOCK DECIDING SYSTEM

(75) Inventor: Jung-Hoon Kim, Gyonggi-Do (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/623,570

(22) Filed: Jul. 22, 2003

(65) Prior Publication Data

US 2004/0119516 A1 Jun. 24, 2004

(30) Foreign Application Priority Data

Jul. 23, 2002 (KR) .................................. 10-2002-0043172

(51) Int. Cl.[7] .............................................. G06F 1/04
(52) U.S. Cl. ........................ 327/292; 327/99; 327/163
(58) Field of Search ......................... 327/99, 152, 158, 327/162, 163, 291–299; 331/49; 326/93–98

(56) References Cited

U.S. PATENT DOCUMENTS

| | | | | |
|---|---|---|---|---|
| 4,999,526 A | * | 3/1991 | Dudley | 327/152 |
| 5,422,915 A | * | 6/1995 | Byers et al. | 375/357 |
| 5,642,069 A | * | 6/1997 | Waite | 327/292 |
| 5,684,418 A | * | 11/1997 | Yanagiuchi | 327/99 |
| 5,886,557 A | * | 3/1999 | Wilcox | 327/292 |
| 6,011,732 A | * | 1/2000 | Harrison et al. | 365/194 |
| 6,289,068 B1 | * | 9/2001 | Hassoun et al. | 375/376 |
| 6,373,308 B1 | * | 4/2002 | Nguyen | 327/161 |
| 6,426,985 B1 | * | 7/2002 | Iwata et al. | 375/371 |
| 6,535,043 B2 | * | 3/2003 | Chen | 327/291 |
| 6,556,249 B1 | * | 4/2003 | Taylor et al. | 348/497 |

\* cited by examiner

*Primary Examiner*—Timothy P. Callahan
*Assistant Examiner*—Hai L. Nguyen
(74) *Attorney, Agent, or Firm*—Fleshner & Kim, LLP

(57) ABSTRACT

A clock deciding apparatus generates a plurality of delay clock signals and outputs a clock signal most similar to an outer clock signal to reduce the time used to decide the clock greatly. Also, even if a frequency of the clock signal is changed slightly or phase shift happens due to outer causes, the clock deciding apparatus according to the present invention is able to correspond to the above situations rapidly, and therefore, stable clock signal can be provided to the system.

26 Claims, 7 Drawing Sheets

MULTI CLOCK DECIDING SYSTEM

BACKGROUND OF THE INVENTION

1. Field of the Invention

The present invention relates to a digital system, and particularly, to a clock provided to a digital system.

2. Background of the Related Art

A clock used as an operating source in various digital circuits functions as a core of the circuit. Therefore, an accurate and stable clock frequency is required. In addition, as the digital circuit becomes faster and more precise, an accurate and stable clock becomes increasingly more important to reliable circuit operation. Moreover, in a field requiring high reliability such as communication equipment, multiple clock signals are used in order to address the problems of one clock generating source.

Hereinafter, a clock deciding apparatus according to the related art will be described with reference to accompanying FIG. 1. As shown therein, the related art clock deciding apparatus comprises: a phase locked loop (PLL) circuit 100 for converting a received frequency of a reference clock into a frequency used in the system; a multiplexer 140 for receiving a clock signal outputted from the PLL circuit 100 and an outer clock signal and outputting one of the two signals; an error detecting unit 110 for identifying whether or not there is an error in the received reference clock; a control unit 120 for outputting a predetermined control signal as referring to the test result of the error detecting unit 110 and a received outer control signal; and a clock selecting unit 130 for controlling the multiplexer 140 by decoding the control signal of the control unit 120.

The reference clock signal of a clock supplying source is transmitted to the PLL circuit 100 of the clock deciding apparatus, the PLL circuit 100 converts the frequency of the received reference clock into the frequency used in the system, and after that, transmits the signal to the multiplexer 140. Hereinafter, the reference clock signal outputted from the PLL circuit 100 is referred to as "P-reference clock signal".

The error detecting unit 110 identifies whether there is an error on the received reference clock signal. Then, the result of the identification is notified to the control unit 120. The control unit 120 decides whether the clock deciding system including itself is a master or a slave referring to the outer control signal, and decides whether the reference clock signal is normal or abnormal referring to the result of the error detecting unit 110.

In addition, the control unit 120 outputs a predetermined signal for controlling the multiplexer 140 to the clock selecting unit 130 based on the decision. The clock selecting unit 130 outputs the control signal of the control unit 120 to the multiplexer 140 after decoding it. In addition, according to the control of the clock selecting unit 130, the multiplexer 140 selects one of the P-reference clock signal and the outer clock signal, and outputs the selected one.

The two apparatuses (dock deciding apparatuses A and B) having a dual structure, as described above, perform the same operation. However, these apparatuses are in a complementary relationship with each other. If the clock signal of the apparatus A is abnormal, apparatus A receives the clock signal of apparatus B through a path connected to apparatus B and outputs it. Therefore, it is able to provide the system with a stable and continuous clock signal.

However, according to the related art device, it takes a lot of time for locking the PLL circuit. Also, if the time points of PLL locking in the clock deciding apparatus A and the clock deciding apparatus B are different from each other, the phases of the clock signals outputted from the two deciding apparatuses are different. The above problem causes degradation of the clock signal provided to the system since the duty is changed rapidly at the time when the dual switching is generated. In the digital circuits and systems, the degradation of the clock signal can cause a fatal error.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

To achieve the objects of the present invention, as embodied and broadly described herein, there is provided a multi clock deciding system comprising: a clock deciding apparatus (master) outputting a system clock signal; a plurality of clock deciding apparatuses (slaves) generating a plurality clock signals delaying reference clock signal, and outputting a clock signal having minimum phase difference from the system clock signal; and a multi clock selecting unit for receiving the clock signals of the respective clock deciding apparatuses and re-inputting the clock signal of the master into the respective clock deciding apparatuses. In case that the slave is one, the multi clock selecting unit is not disposed, and in that case, the output of the master is inputted into the slave and the output of the slave is inputted into the slave.

Preferably, the slave performs a step of converting the frequency of the reference clock into a frequency used in the system; a step of generating a plurality of delay clock signals by delaying the converted reference clock signals (P-clock signals) for a predetermined time; a step of comparing the phase of the system clock signal to phases of the respective delay clock signals; and a step of selecting and outputting the delay clock signal having minimum phase difference from the system clock signal referring to comparing result.

Preferably, the respective clock deciding apparatus comprises; a phase locked loop (PLL) circuit receiving reference clock signal; a signal delaying unit for delaying the P-clock signal outputted from the PLL circuit to generate a plurality of delay clock signals; a multiplexer selecting and outputting one of the delay clock signals; a phase comparing unit for detecting an R-clock signal having minimum phase difference with the system clock signal among the delay clock signals; an error detecting unit for detecting an error of the reference clock signal and the system clock signal; a control unit for outputting a predetermined control signal referring the detecting result of the error detecting unit and an outer control signal; and a clock selecting unit controlling the multiplexer by referring to the output of the phase comparing unit according to the control signal.

Preferably, the signal delaying unit comprises a plurality of signal delay elements and the delay clock signals have different delayed time from those of each other respectively.

Additionally, an embodiment of the present invention can include a method for selecting multiple clock signals. The method comprises: outputting a system clock signal from a master clock device; generating a plurality of clock signals in a slave clock device by delaying a reference clock signal; outputting a clock signal from the slave clock device having a minimum phase difference from the system clock signal; and inputting the master output clock signal into the slave and the slave output clock signal into the master.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to describe the embodiments of the invention.

DETAILED DESCRIPTION OF PREFERRED EMBODIMENTS

Figure 1:
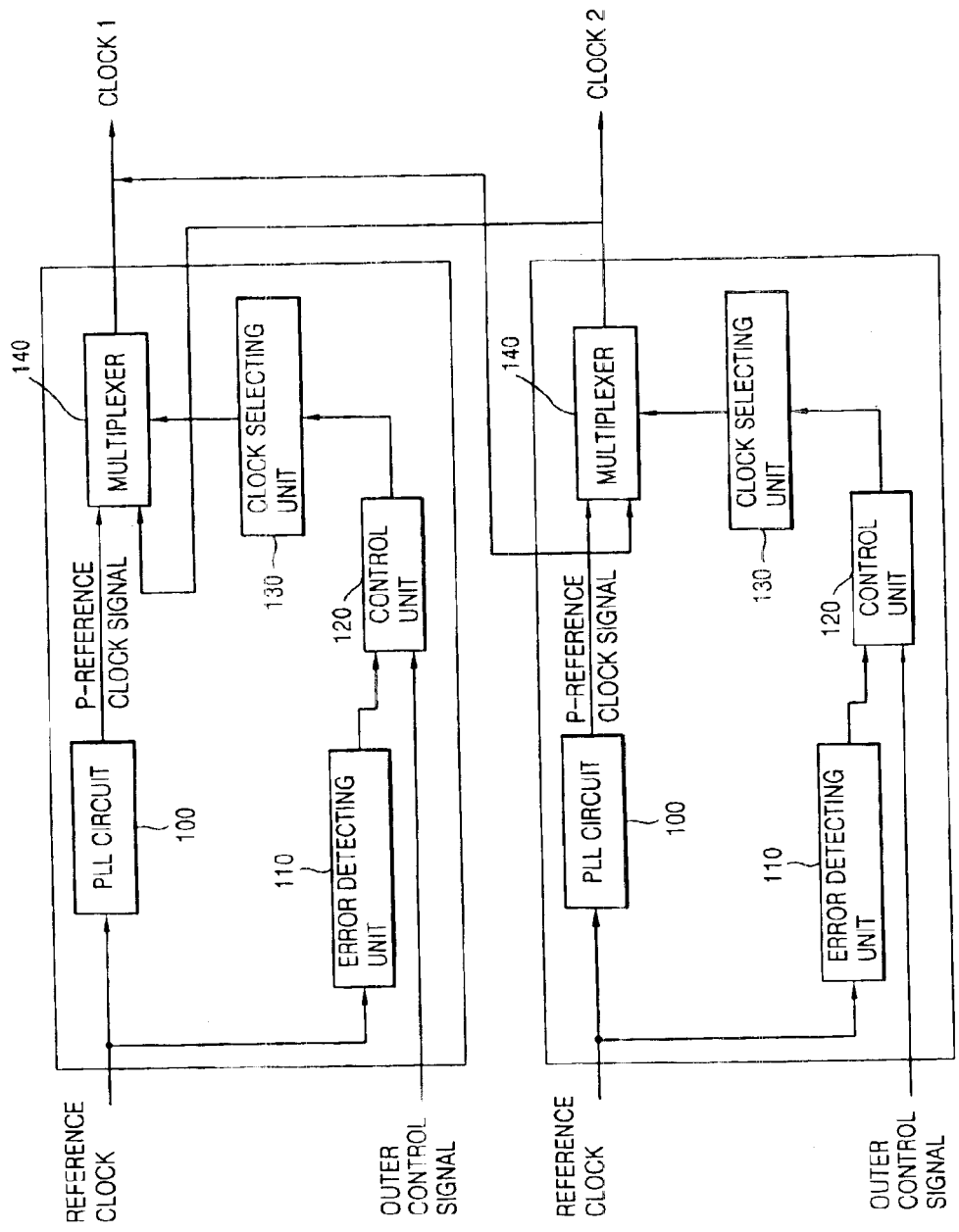
FIG. 1 is a block diagram showing a dual clock deciding system according to the related art.
Figure 2:
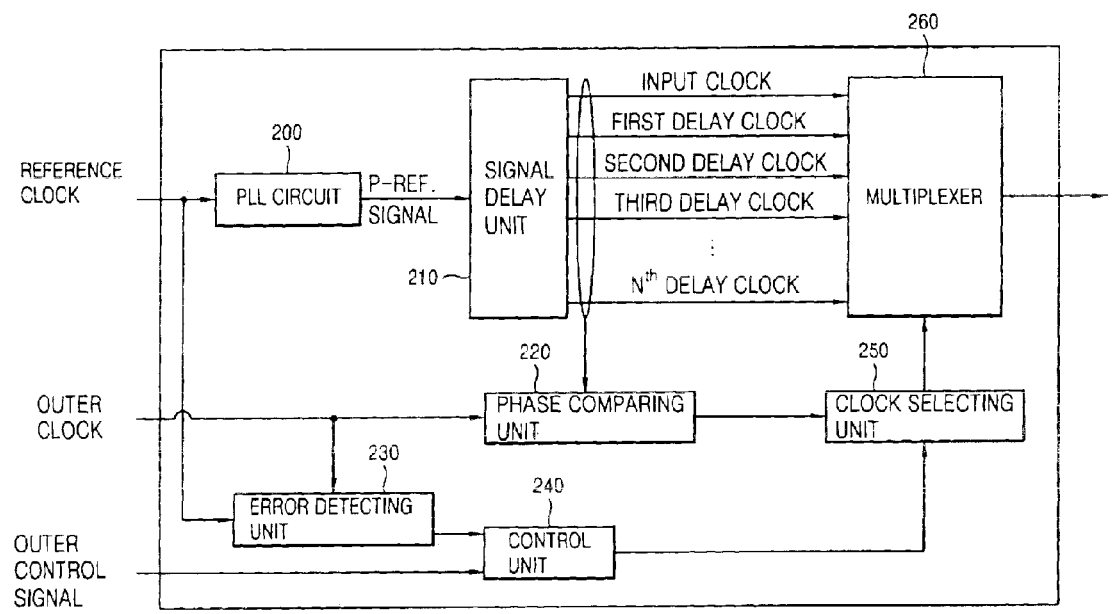
FIG. 2 is a block diagram showing a clock deciding apparatus according to an embodiment of the present invention.

FIG. 2 is a block diagram showing a clock deciding apparatus according to the present invention. As shown in FIG. 2, the clock deciding apparatus comprises: a PLL circuit 200, a signal delay unit 210, a phase comparing unit 220, an error detecting unit 230, a control unit 240, a clock selecting unit 250 and a multiplexer 260. The PLL circuit 200 receives a reference clock signal from a clock supplying source, and converts a frequency of the received reference clock signal into a frequency used in the system.

Figure 3:
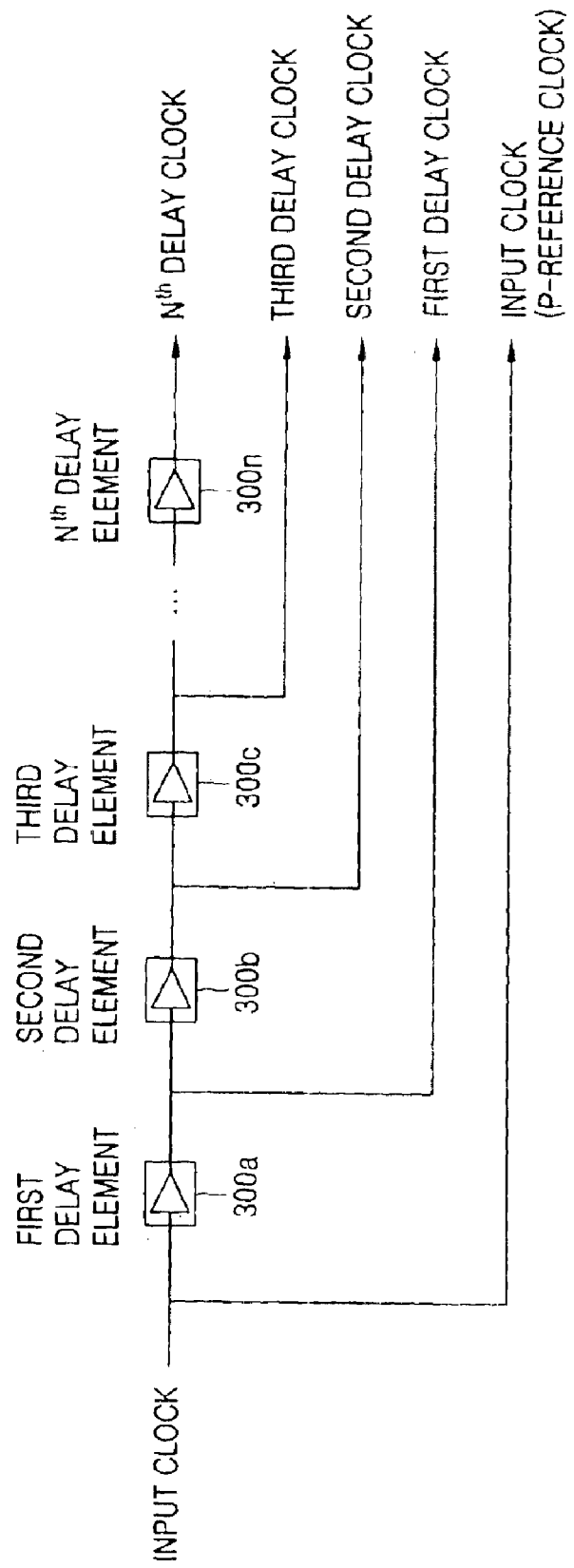
FIG. 3 is a brief block diagram showing a clock delaying unit according to an embodiment of the present invention.

The signal delay unit 210 delays the P-reference clock signal to generate a plurality of delay clock signals. The signal delay unit 210 comprises n delay elements (first delay element, second delay element, . . . , nth delay element) as shown in FIG. 3, and outputs N clocks having different delayed times from those of each other.

The phase comparing unit 220 compares a phase of an outer clock signal to those of the delay clock signals generated by the signal delay unit 210 respectively to detect the delay clock signal having a minimum phase difference, and transmits information about the detected clock signal to the clock selecting unit 250.

The error detecting unit 230 identifies whether there is an error in the received reference clock signal and the outer clock signal. And it notifies the control unit 240 of the identifying result. The control unit 240 decides whether the clock deciding apparatus including itself is a master or a slave referring to an outer control signal, and decides whether the reference clock signal and the outer clock signal are normal or abnormal referring to the identifying result of the error detecting unit 230. In addition, the control unit 240 controls the clock selecting unit 250 based on the decided result.

The clock selecting unit 250 is operated differently when the clock deciding apparatus itself is the slave and when the clock deciding apparatus is the master. When the clock deciding apparatus including the clock selecting unit 250 is the master, the clock selecting unit 250 does not refer to the output of the phase comparing unit 220. In contrast, when the clock deciding apparatus is the slave, the clock selecting unit 250 decodes the output signal of the phase comparing unit 220 and controls the multiplexer 260 using the decoded signal. However, if the outer clock signal received in the slave is abnormal, the clock selecting unit 250 does not refer to the output of the phase comparing unit 220. The multiplexer 260 receives a plurality of clock signals from the signal delay unit 210, and outputs one of the signals after selecting it.

Figure 4:
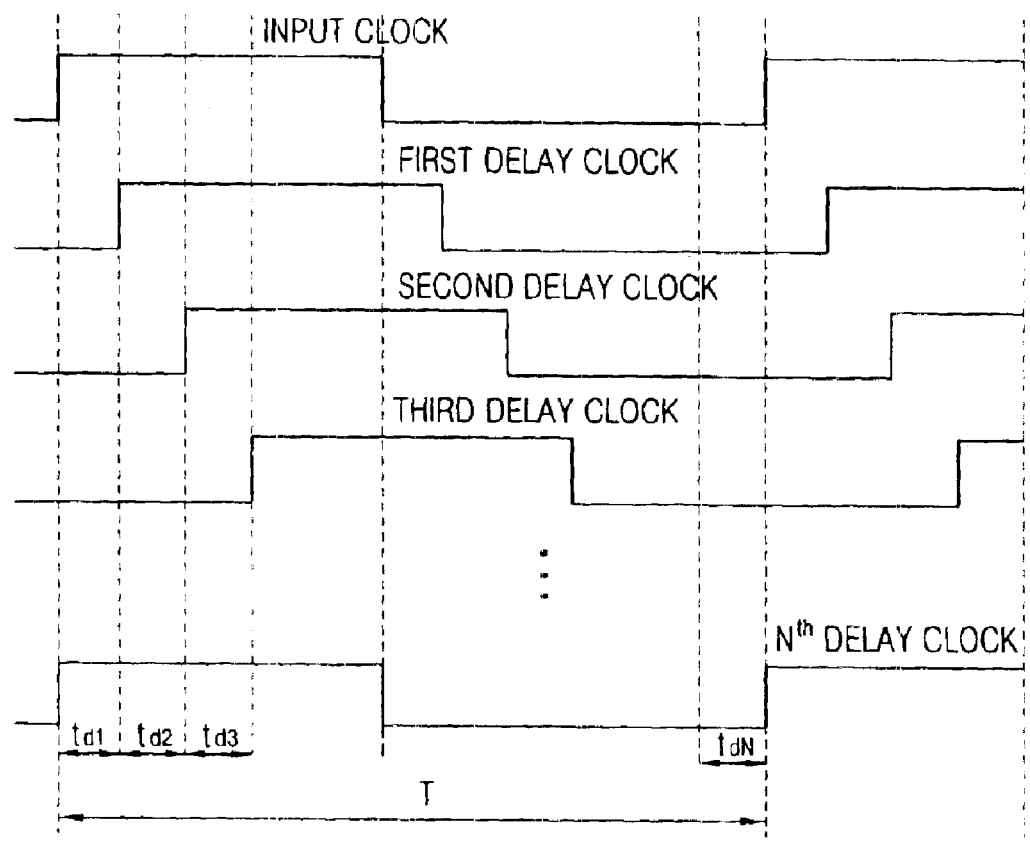
FIG. 4 is a view showing a clock signal generated by the clock delaying unit according to an embodiment of the present invention.

FIG. 3 is a block diagram showing the signal delay unit 210 according to an embodiment of the present invention. FIG. 4 is a view showing the clock signal generated by the signal delay unit 210 according to an embodiment of the present invention.

As shown in FIG. 3, the signal delay unit 210 comprises a plurality of delay elements 300a, 300b, 300c, . . . , 300n. As shown in FIG. 4, the first delay element delays an input clock signal for a predetermined time ($t_{d1}$) and outputs first delay clock signal delayed as much as $t_{d1}$, the second delay element delays the first delay clock signal for a predetermined time ($t_{d2}$) again and outputs a second delay clock signal delayed as much as $t_{d1}+t_{d2}$, and the third delay element delays the second delay clock signal for a predetermined time ($t_{d3}$) again and outputs a third delay clock signal delayed as much as $t_{d1}+t_{d2}+t_{d3}$. The above process is repeatedly performed until the nth delay element. The delay elements 300a, 300b, 300c, . . . , 300n can perform a delay of a same time Alternatively, each delay can be for a different time, respectively, according to the selected delay elements in designing the device.

Using a period of a clock pulse inputted into the signal delay unit 210, a relationship between delayed time and the pulse period can be represented as following equation 1. As the delayed time of the delay element decreases, the less the phase difference becomes, and a precise phase control can be made.

$$T = t_{d1} + t_{d2} + t_{d3} + \ldots + t_{dn} \tag{1}$$

Where T=period of clocks, and $t_{d1}, t_{d2}, t_{d3}, \ldots, t_{dn}$: clock delayed time. If the delay elements included in the signal delay unit 210 are arranged in a parallel structure, the signal delay unit 210 can comprise n delay elements such as the first delay element delaying for a period $t_{d1}$, the second delay element delaying for a period $t_{d1}+t_{d2}$, the third delay element delaying for a period $t_{d1}+t_{d2}+t_{d3}$, and n delay element delaying for a period $t_{d1}+t_{d2}+t_{d3}, \ldots, +t_{dn}$.

Figure 5:
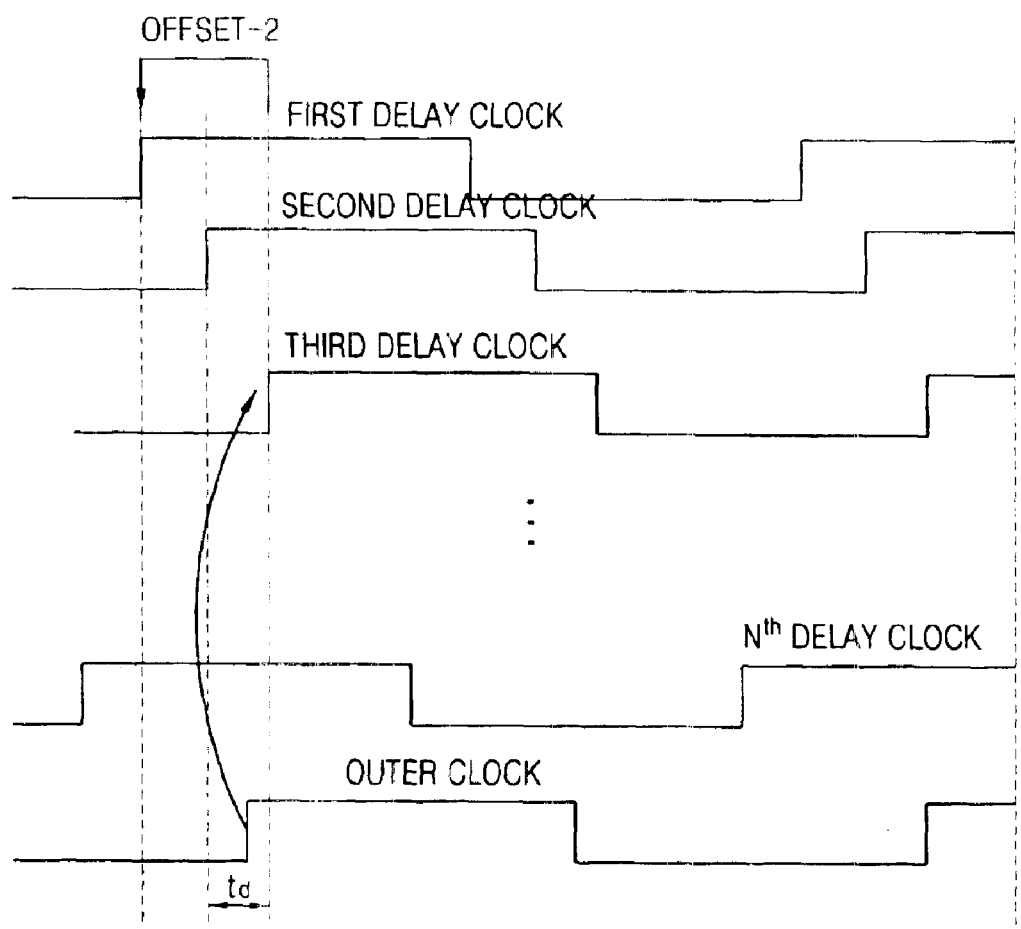
FIG. 5 is a view illustrating a method of selecting delay clock by a phase comparing unit according to an embodiment of the present invention.

FIG. 5 is a diagram illustrating a method for selecting the delay clock of the phase comparing unit according to an embodiment of the present invention. The phase comparing unit 220 selects the delay clock signal among the delay clock signals having a same phase as that of the outer clock signal. More precisely, the phase comparing unit 220 selects the delay clock signal having a minimum phase difference from that of the outer clock signal. In FIG. 5, since the second delay clock signal is '1' and the third delay clock signal is '0' when a rising edge ('0'→'1') of the outer clock signal, the delay dock having the minimum phase difference from that of the outer clock signal is the second delay clock signal or the third delay clock signal.

In addition, if the phase comparing unit 220 decides that the third delay clock signal is the most similar clock signal to the outer clock signal, the phase comparing unit 220 transmits the clock information of the third delay clock signal to the clock selecting unit 250. As shown in FIG. 5, maximum phase difference in the present invention is $t_d$.

The clock selecting device according to an embodiment of the present invention is able to control the phase of the delay clock signal which is decided to be most similar to the outer clock signal using an offset value. That is, a discretionary value is set on the offset to make the phase of the third delay clock signal have constant phase difference from that of the outer clock signal.

As described above, the clock selecting unit 250 is operated differently depending on whether the clock deciding apparatus itself is the slave or the master. The clock selecting unit 250 controls the multiplexer 260 referring to the output of the phase comparing unit 220 when the clock deciding apparatus including the clock selecting unit 250 is the slave. That is, the clock selecting unit 250 decodes the output of the phase comparing unit 220, and outputs the decoded signal to the multiplexer 260. In addition, the multiplexer 260 selects and outputs the delay clock signal which is most similar to the outer clock signal.

In contrast, when the clock deciding apparatus including the clock selecting unit 250 is the master, the clock selecting unit 250 does not refer to the output of the phase comparing unit 220 and controls the multiplexer 260 so that the multiplexer 260 outputs the P-reference clock signal. The operation of the clock selecting unit 250 is same when the outer clock signal received in the slave is abnormal.

The control unit 240 decides whether the corresponding clock deciding apparatus is the master or slave, and controls the clock selecting unit 250 so that the clock selecting unit 250 refers or does not refer to the output of the phase comparing unit 220. Also, the control unit 240 decided whether the outer clock signal is normal or abnormal, and controls the clock selecting unit 250 so as not to refer to the output of the phase comparing unit 220 when the outer clock signal is abnormal.

Figure 6:
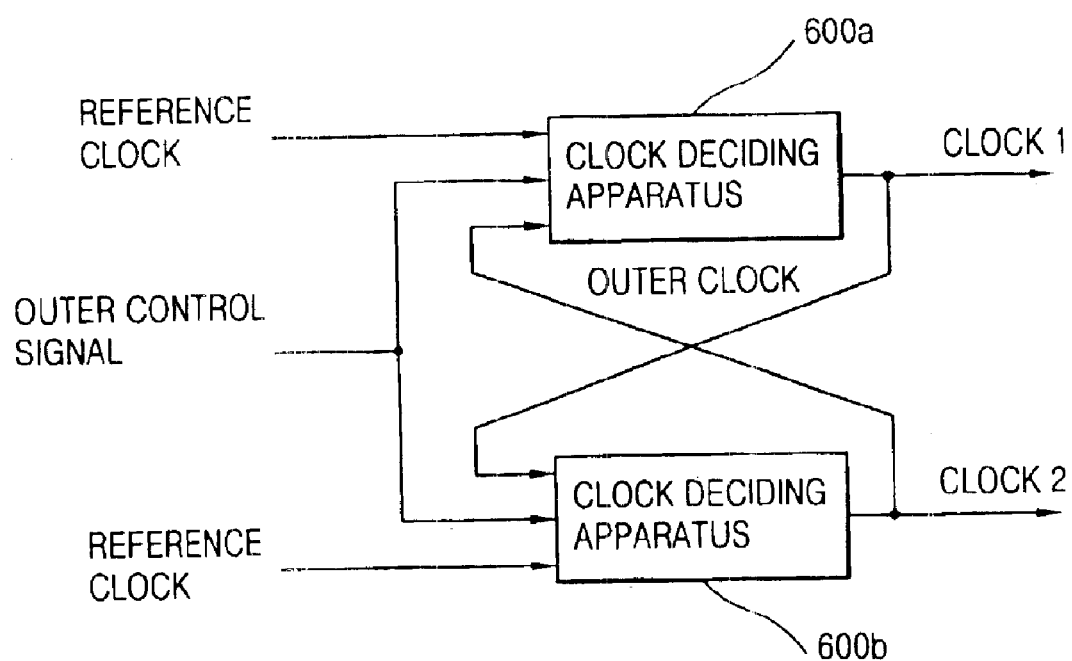
FIG. 6 is a block diagram showing a dual clock deciding system according to an embodiment of the present invention.

FIG. 6 is a block diagram showing a dual clock deciding system according to an embodiment of the present invention. As shown in FIG. 6, the clock deciding apparatus 600*a* receives the reference clock signal, the outer clock signal (clock signal 2) and the outer control signal, and outputs clock signal 1.

The clock deciding apparatus 600*a* is able to recognize whether itself is the master or the slave by referring to the outer control signal. When the clock deciding apparatus 600*a* is the master, the clock deciding apparatus 600*a* does not refer to the output (selecting clock information) of the phase comparing unit 220 and selects the P-reference clock signal as the output signal (clock signal 1). In addition, the output signal (clock signal 1) of the clock deciding apparatus 600*a* becomes a system clock. On the contrary, when the clock deciding apparatus 600*a* is the slave, the clock deciding apparatus 600*a* outputs the delay clock signal which is most similar to the outer clock signal (clock signal 2) by referring to the output (selecting clock information) of the phase comparing unit 220. The slave 600*a* is a backup device in case there is an error on the master, and therefore, the slave 600*a* monitors the clock signal (system clock signal) of the master 600*b* to maintain its own clock signal to be same as that of the master 600*b*.

The clock deciding apparatus 600*b* receives the reference clock signal, the outer clock signal (clock signal 1) and the outer control signal, and outputs the clock signal 2. When the clock deciding apparatus 600*a* is operated as the master, then the clock deciding apparatus 600*b* is operated as the slave. And the operating method of clock deciding apparatus 600*b* is same as that when clock deciding apparatus 600*a* is the slave. On the contrary, when the clock deciding apparatus 600*a* is operated as the slave, the clock deciding apparatus 600*b* is operated as the master, and the operating method of the clock deciding apparatus 600*b* is same as that when the clock deciding apparatus 600*a* is the master.

Figure 7:
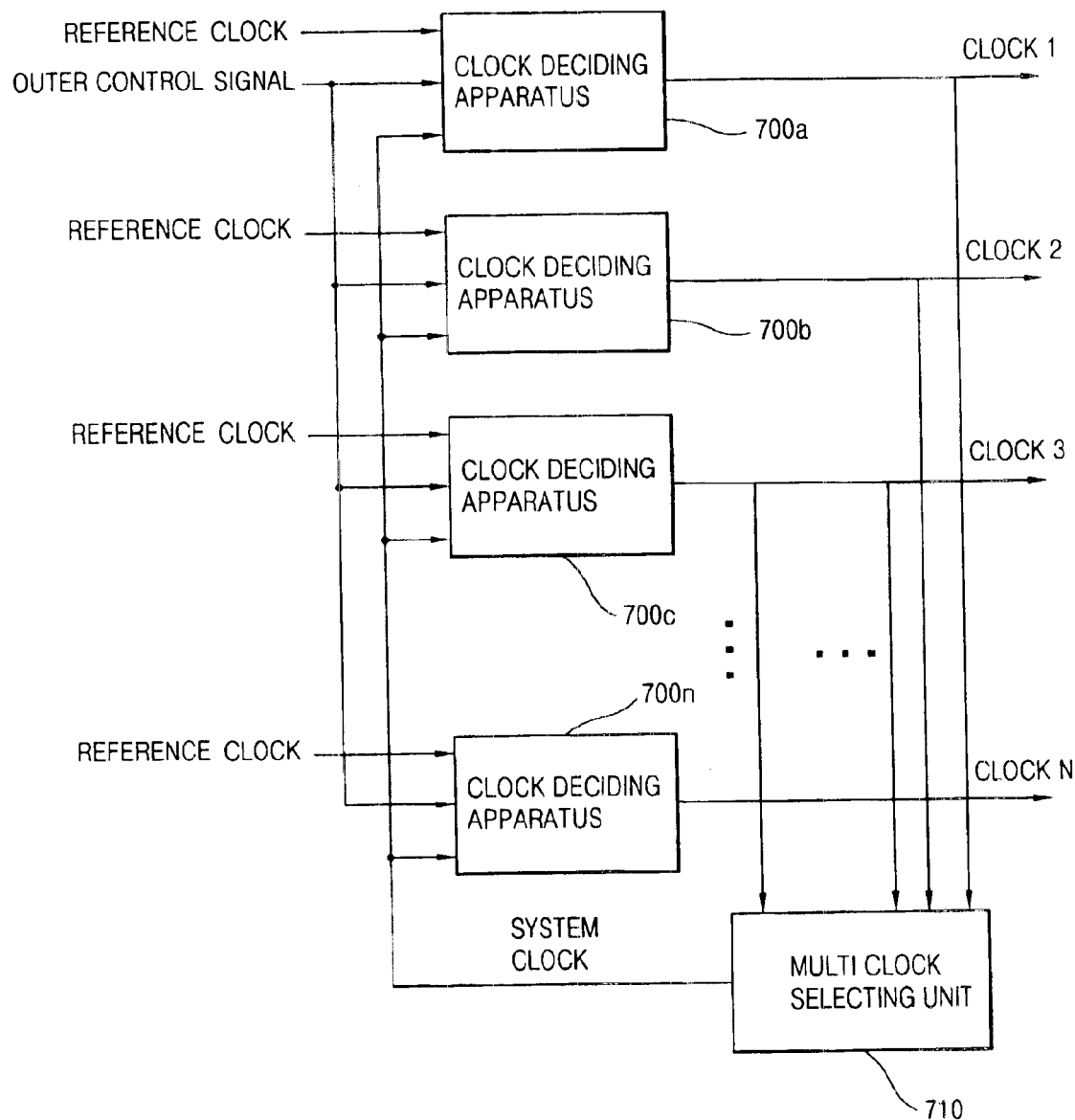
FIG. 7 is a block diagram showing a multi clock deciding system according to an embodiment of the present invention.

FIG. 7 is a block diagram showing a multi clock deciding system according to the present invention. As shown in FIG. 7, the multi clock system comprises n clock deciding apparatuses 700*a*, 700*b*, 700*c*, . . . , 700*n* and a multi clock selecting unit 710, for purposes of illustration only, it is assumed that the clock deciding apparatus 700*a* is the master.

The clock deciding apparatuses 700*a*, 700*b*, 700*c*, . . . , 700*n* generate clock signal 1, clock signal 2, clock signal 3, . . . , clock signal n, respectively. The multi clock selecting unit 710 is a device for providing the clock deciding apparatuses 700*a*, 700*b*, 700*c*, . . . , 700*n* with the system clock signal (or the clock signal of the master), receives the clock signals 1, 2, 3, . . . , n and outputs the system clock signal (clock signal 1) among the inputted clock signals into the clock deciding apparatuses 700*a*, 700*b*, 700*c*, . . . , 700*n*. If there is an error on the system clock signal, the multi clock selecting unit 710 selects the another inputted clock signal and outputs it to the clock deciding apparatuses 700*a*, 700*b*, 700*c*, . . . , 700*n*.

While the clock deciding apparatus 700*a* is the master, the respective clock deciding apparatuses 700*b*, 700*c*, . . . , 700*n* outputs the delay clock signal which is most similar to the system clock signal among the delay clock signals generated by themselves. That is, the slaves (clock deciding apparatuses 700*b*, 700*c*, . . . , 700*n*) maintain the clock signals of themselves to be the same as the clock signal of the master 700*a*.

The processes of generating system clock signal by the respective clock deciding apparatuses 700*a*, 700*b*, 700*c*, . . . , 700*n* and the components 200, 230, 240, 250 and 260 are same as described above in the foregoing description. As described above, the clock deciding apparatus according to an embodiment of the present invention generates a plurality of delay clock signals, and outputs the clock signal most similar to the outer clock signal, and therefore, the time used to decide the clock can be greatly reduced when a clock failure occurs.

Also, even if the frequency of the clock signal is changed slightly or the phase shift happens due to other causes, the clock deciding apparatus according to an embodiment of the present invention is able to address the above situations rapidly. Therefore, a stable clock signal can be provided to the system. Additionally, according to an embodiment of the present invention, the unit delayed time of the delay element decides the phase difference, and therefore, the accuracy of the phase control can be controlled by adjusting the delay element.

Further, according to an embodiment of the present invention, the offset value is set discretionary to control the constant phase difference between the delay clock signal and the outer clock signal. Also, the clock deciding apparatus according to an embodiment of the present invention does not require a micro processor and an additional algorithm (or controlling logic) for controlling the PLL circuit, and does not require an analog-digital converter for detecting the phase of the clock signal. Therefore, the complexity of the clock deciding apparatus can be reduced.

The foregoing embodiments and advantages are merely exemplary and are not to be construed as limiting the present invention. As the present invention can be embodied in several forms without departing from the spirit or characteristics thereof, it should also be understood that the above-described embodiments are not limited by any of the details of the foregoing description but rather should be construed broadly within its spirit and scope as defined in the appended claims. Therefore all changes and modifications that fall within the metes and bounds of the claims, or equivalence of such metes and bounds are intended to be embraced by the appended claims.

What is claimed is:

1. A multi clock deciding system comprising:
   a master clock deciding apparatus (master) configured to output a system clock signal;
   a plurality of slave clock deciding apparatuses (slaves), each configured to generate a plurality of delay clock signals by delaying a reference clock signal, and to output a clock signal selected from the plurality of delay clock signals having a minimum phase difference from the system clock; and
   a multi clock selecting unit configured to receive the clock signals output from the master and slaves and to supply the system clock signal to the master and slaves.

2. The system of claim 1, wherein the multi clock selecting unit outputs one of the slave clock outputs if there is an error on the clock signal of the master.

3. The system of claim 1, wherein each clock deciding apparatus comprises:
   a phase locked loop (PLL) circuit configured to receive the reference clock signal and to output a P-clock signal;
   a signal delay unit configured to delay the P-clock signal outputted from the PLL circuit to generate the plurality of delay clock signals;
   a multiplexer configured to select and to output one of the delay clock signals;
   a phase comparing unit configured to detect an R-clock signal having the smallest phase difference from the system clock signal among the delay clock signals;
   an error detecting unit configured to detect an error on the reference clock signal and the system clock signal;
   a control unit configured to output a select control signal by referring to the result of the error detecting unit and an outer control signal; and
   a clock selecting unit configured to control the multiplexer by referring to the output of the phase comparing unit according to the select control signal.

4. The system of claim 3, wherein the phase comparing unit detects the R-clock signal by comparing rising edge of the system clock signal to rising edge points of the respective delay clock signals.

5. The system of claim 3, wherein the clock selecting unit controls the multiplexer so as to output the P-clock signal when the control signal decides that the clock deciding apparatus is the master, and controls the multiplexer so as to output the R-clock signal if the control signal decides that the clock deciding apparatus is the slave.

6. The system of claim 3, wherein the clock deciding apparatus outputs the P-clock signal when an error is detected on the system clock signal.

7. The system of claim 3, wherein the signal delay unit comprises a plurality of signal delay elements.

8. The system of claim 3, wherein the delay clock signals have different delayed time from those of each other.

9. The system of claim 3, wherein each clock deciding apparatus generates the clock signal having a phase difference as much as an offset value with the system clock signal referring to the offset value.

10. The system of claim 9, wherein the offset value is variable.

11. The system of claim 1, wherein the slave is configured to:
    convert the frequency of the reference clock into the frequency used in the system;
    generate the plurality of delay clock signals by delaying the converted reference clock signal (P-clock signal) for a predetermined time;
    compare a phase of the system clock signal to phases of the respective delay clock signals; and
    select and output one the delay clock signals having the minimum phase difference from the system clock signal by referring to the phase comparison result.

12. The system of claim 11, wherein comparing phases compares the rising edges of the system clock signal and of the respective delay clock signals.

13. The system of claim 11, wherein the slave is further configured to detect an error on the reference clock signal and/or the system clock signal.

14. The system of claim 13, wherein the slave outputs the P-clock signal when the error is detected on the system clock signal.

15. A multi clock deciding system comprising:
    a master clock deciding apparatus (master) configured to output a system clock signal; and
    a slave clock deciding apparatus (slave) configured to generate a plurality of clock signals by delaying a reference clock signal, and to output a clock signal selected from the plurality of clock signals having a minimum phase difference from the system clock,
    wherein the output of the master is directly inputted into the slave and the output of the slave is directly inputted into the master.

16. A multi clock selecting method comprising
    generating a first output clock signal;
    generating a second output clock signal by generating a plurality of delay clock signals by delaying a reference clock signal, and selecting one of the delay clock signals having a minimum phase difference from the first clock signal as the second output clock signal;
    receiving the output clock signals in a selecting unit; and
    supplying a system clock signal from the selecting unit to respective clock devices that generate the first and second output clock signals,
    wherein the selecting unit outputs the second output clock signal as the system clock signal if there is an error in the first output clock signal.

17. The method of claim 16, wherein an output clock signal of each clock device is generated by:
    generating a P-clock signal by inputting the reference clock signal into a phase locked loop (PLL) circuit;
    delaying the P-clock signal to generate the plurality of delay clock signals;
    detecting an R-clock signal having the minimum phase difference from the system clock signal among the delay clock signals;
    outputting a select control signal based on detecting an error on the reference clock signal and/or the system clock signal and an outer control signal; and
    selecting the output clock signal according to the select control signal.

18. The method of claim 17, wherein selecting the output clock signal comprises:
  outputting the P-clock signal if the control signal indicates that the clock device is a master; and
  outputting the R-clock signal if the control signal indicates that the clock device is a slave.

19. The method of claim 17, further comprising:
  outputting the P-clock signal when an error is detected on the system clock signal.

20. The method of claim 17, wherein the plurality of delay clock signals is generated by a plurality of signal delay elements.

21. The method of claim 17, wherein the plurality of delay clock signals each have different delay times.

22. The method of claim 17, wherein the R-clock signal is detected by comparing a rising edge of the system clock signal to rising edges of the delay clock signals.

23. The method of claim 16, wherein generating the second output clock signal further comprises:
  converting a frequency of the reference clock into a system operating frequency;
  generating the plurality of delay clock signals by delaying the converted reference clock signal (P-clock signal);
  comparing a phase of the first clock signal to phases of the delay clock signals; and
  selecting and outputting one of the delay clock signals having the minimum phase difference from the first clock signal by referring to the phase comparison result.

24. The method of claim 23, wherein comparing the phases comprises:
  comparing the rising edge of the first clock signal to rising edges of the delay clock signals.

25. The method of claim 23, further comprising:
  detecting an error on the reference clock signal and/or the first clock signal.

26. The method of claim 25, further comprising
  outputting the P-clock signal when the error is detected on the first clock signal.

* * * * *